United States Patent
Pinta et al.

(10) Patent No.: US 9,698,459 B2
(45) Date of Patent: Jul. 4, 2017

(54) CIRCUIT ON A THIN CARRIER FOR USE IN HOLLOW CONDUCTORS AND A MANUFACTURING METHOD

(71) Applicants: Rohde & Schwarz GmbH & Co. KG, Munich (DE); RPG Radiometer Physics GmbH, Meckenheim (DE)

(72) Inventors: Christian Pinta, Munich (DE); Mathias Nagel, Munich (DE); Gerd Hechtfischer, Vaterstetten (DE); Achim Walber, Rheinbach (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/764,928

(22) PCT Filed: Jan. 23, 2014

(86) PCT No.: PCT/EP2014/051335
§ 371 (c)(1),
(2) Date: Jul. 30, 2015

(87) PCT Pub. No.: WO2014/118079
PCT Pub. Date: Aug. 7, 2014

(65) Prior Publication Data
US 2015/0372368 A1 Dec. 24, 2015

(30) Foreign Application Priority Data

Jan. 31, 2013 (DE) .................. 10 2013 201 593
Feb. 21, 2013 (DE) .................. 10 2013 202 806

(51) Int. Cl.
*H01P 3/12* (2006.01)
*H05K 1/02* (2006.01)
(Continued)

(52) U.S. Cl.
CPC ............ *H01P 3/12* (2013.01); *H01P 3/087* (2013.01); *H01P 11/002* (2013.01); *H05K 1/02* (2013.01);
(Continued)

(58) Field of Classification Search
CPC .................................. H01P 3/12; H05K 3/00
(Continued)

(56) References Cited

U.S. PATENT DOCUMENTS

| | | | |
|---|---|---|---|
| 5,140,285 A | 8/1992 | Cohen | |
| 5,867,073 A | 2/1999 | Weinreb et al. | |

(Continued)

FOREIGN PATENT DOCUMENTS

| | | |
|---|---|---|
| DE | 69625654 T2 | 9/2003 |
| EP | 0557081 A1 | 8/1993 |

(Continued)

OTHER PUBLICATIONS

C. T.-C. Nguyen, L. P.B. Katehi, and G. M. Rebeiz, "Micromachined devices for wireless communications (invited)," Proc. IEEE, vol. 86, No. 8, pp. 1756-1768, Aug. 1998.*

(Continued)

*Primary Examiner* — Dameon E Levi
*Assistant Examiner* — Andrea Lindgren Baltzell
(74) *Attorney, Agent, or Firm* — Lee & Hayes, PLLC

(57) ABSTRACT

A substrate-based circuit (31) provides a carrier substrate (2), wherein a bond layer (5) is embodied on at least one part of the carrier substrate (2), and wherein a contact layer (6) which forms at least one conductor line (7) and/or at least one antenna element (8) is embodied on at least one first part ($5_1$) of the bond layer (5). The carrier substrate (2) provides at least one fastening element (20), which is deposited at the (Continued)

Figure 1A:
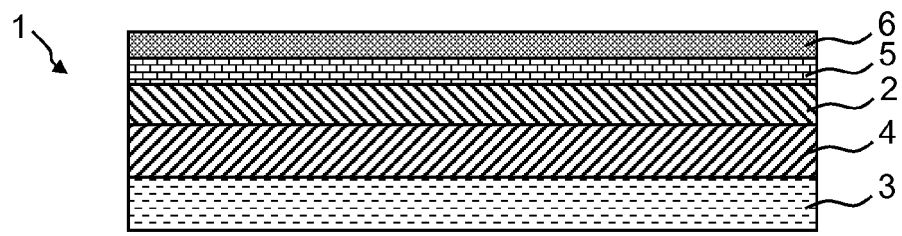

outer region of the carrier substrate (2) and projects beyond the outer region of the carrier substrate (2).

17 Claims, 12 Drawing Sheets

(51) Int. Cl.
*H01P 3/08* (2006.01)
*H01P 11/00* (2006.01)
*H05K 3/00* (2006.01)
*H01P 1/207* (2006.01)

(52) U.S. Cl.
CPC ............. *H05K 3/007* (2013.01); *H01P 1/207* (2013.01); *H05K 2201/09781* (2013.01); *H05K 2201/2009* (2013.01); *Y10T 29/49158* (2015.01)

(58) Field of Classification Search
USPC ......................................................... 343/905
See application file for complete search history.

(56) References Cited

U.S. PATENT DOCUMENTS

2004/0048420 A1   3/2004  Miller

2009/0174499 A1*  7/2009  Hiramatsu ................ G01S 7/03
                                                          333/139
2009/0230380 A1   9/2009  Leon et al.
2012/0061851 A1*  3/2012  Rathburn ............ B23K 1/0016
                                                          257/774
2012/0266116 A1* 10/2012  Ding .................... H01O 1/2283
                                                          716/101

FOREIGN PATENT DOCUMENTS

| EP | 0760636 A1 | 3/1997 | | |
|---|---|---|---|---|
| JP | 2012023661 A | 2/2012 | | |
| WO | WO2007149046 A1 | 12/2007 | | |
| WO | WO2010/147782 | * 12/2010 | ............ | H01L 23/48 |

OTHER PUBLICATIONS

Wolfgang Menzel, et al., "Miniaturized Suspended Stripline Filters for Integration into Extended Circuits", Microwave Conference, 2006, 36th European, IEEE, PI, 1. Sep. 2006, pp. 909-912.

Gabriel M. Rebeiz, et al., "Michromachined Membrane Filters for Microwave and Millimeter-Wave Applications" (Invited Article), International Journal of Microwave and Millimeter-Wave Computer-Aided Engineering vol. 7, No. 2, Mar. 1, 1997, pp. 149-166.

* cited by examiner

CIRCUIT ON A THIN CARRIER FOR USE IN HOLLOW CONDUCTORS AND A MANUFACTURING METHOD

The invention relates to a method for manufacturing a circuit with at least one conductor line arranged on a carrier substrate, and a substrate-based circuit which provides such a thin carrier substrate and a corresponding hollow conductor which provides a substrate-based circuit.

In microwave technology, electromagnetic waves, typically up to a frequency of 110 GHz, are guided in coaxial cables. Above this frequency, hollow conductors are used as waveguides. The signal processing (frequency filtering, frequency multiplication, attenuation, amplification, mixing, combining (for example, diplexing)) takes place on substrate-based circuits. For this purpose, the wave must be coupled to the substrate and decoupled again. With increasing frequency—especially for the terahertz range (0.1 to 100 THz)—the requirements for these substrate-based circuits are relatively higher. Accordingly, small dimensions, narrower tolerances and very good electrical properties are required. Semiconductor components (or generally non-linear components) which are to be integrated correspondingly into the substrate-based circuit are required for the signal-processing steps of multiplication and mixing. The carrier substrate used must be permeable for the intended frequency range and therefore low-loss. For only in this manner, can the electromagnetic waves be coupled to the substrate-based circuit and guided via corresponding lines on the substrate-based circuit within a hollow conductor. Accordingly, the substrate-based circuit must be very thin, so that the occurrence of cracks in the substrate-based circuit is very probable.

A self-supporting device for microwave transmission and a method for its manufacture are known from EP 0 760 536 A1. EP 0 760 536 A1 describes the problem that the carrier substrate, which is also referred to as a membrane, can easily crack during assembly. Accordingly, EP 0 760 536 A1 recommends that a so-called reinforcement element, which can be an electronic component, is placed onto the membrane and soldered rigidly to the latter, wherein this reinforcement element is wider than the hollow cavity disposed beneath the membrane in which the high-frequency waves are propagated. The disadvantage with EP 0 760 536 A1 is that the cracking of the membrane can only be prevented by placing an electronic component on the latter before the hollow cavity is created. However, such an electronic component is not required in all cases. If, for example, the electromagnetic wave is only to be filtered, this can already be achieved with a corresponding line structure, so that the use of an additional electronic component is not necessary.

The object of the present invention is therefore to provide a method for the manufacture of a substrate-based circuit which provides a good mechanical stability. Furthermore, the object of the invention is to provide a substrate-based circuit, which also provides a good mechanical stability. Finally, a further object of the invention is to provide a hollow conductor in which the substrate-based circuit can readily be used.

The object is achieved with regard to the method for the manufacture of a substrate-based circuit by the features of claim 1, with regard to the substrate-based circuit by the features of claim 11, and with regard to the hollow conductor, which provides the substrate-based circuit, by the features of claim 16. Advantageous further developments of the method according to the invention for the manufacture of the carrier substrate and the substrate-based circuit and the hollow conductor for the substrate-based circuit are specified in the dependent claims.

The method according to the invention for the manufacture of a carrier substrate with at least one conductor line and/or one antenna element arranged on the carrier substrate comprises the method step of application by deposition. Within the method step of application by deposition, at least one fastening element is attached to an outer region of the carrier substrate, wherein the at least one fastening element projects beyond the outer region of the carrier substrate. In this context, the outer region is adjustable.

By preference, the outer region provides a width of 500 µm, by particular preference 300 µm or less than 300 µm. In this context, it is particularly advantageous that such a fastening element is attached to the outer region of the carrier substrate and projects beyond this outer region. Such a fastening by deposition ensures that the mechanical stability of the carrier substrate is increased. The carrier substrate can also be referred to as a membrane which provides a very low loss or no loss for the frequency range of the high-frequency microwave signal. This is achieved through the selection of the material (for example, epsilon r $Si_3N_4$ from 5.5 to 7.4 and tan delta around 0.025 and epsilon r diamond 5.6 and tan delta less than 0.001 dependent upon frequency range) and the carrier thickness. Very thin carriers are therefore advantageous.

In this context, it is also particularly advantageous that the fastening element projects beyond the outer region of the carrier substrate, so that the carrier substrate can be attached, that is, rigidly clamped, within a hollow conductor via these parts of the fastening element which project beyond the outer region of the carrier substrate. The fastening element accordingly provides the shape of a fastening strip or a fastening fin. The fastening element can also be referred to as a so-called beamlead. The fastening element is preferably arranged parallel to the conductor line embodied on the carrier substrate and can provide a good ground connection. The fastening element also allows the carrier substrate to provide a very good thermal contact in addition to good stability.

By preference, the method according to the invention for the manufacture of a carrier substrate provides the following method steps. In a further method step, the carrier substrate is applied to at least one sacrificial carrier. Following this, a bond layer is applied to the carrier substrate. Furthermore, a contact layer is applied to the bond layer, wherein the at least one conductor line and/or the at least one antenna element is formed from the contact layer. Finally, the at least one conductor line and/or the at least one antenna element is structured. In this context, it is particularly advantageous that a bond layer is applied beneath the contact layer so that the contact layer adheres in an optimal manner to the carrier substrate. The use of photolithography for the structuring and the very thin thickness of the contact layer mean that very fine structures can be realised.

Furthermore, an advantage is achieved with the method according to the invention if the method according to the invention comprises the further method steps. In a further method step, the contact layer is removed with the exception of the part which forms the at least one conductor line and/or the at least one antenna element. Alternatively or additionally, the contact layer is removed with the exception of the part which is embodied as a support surface for at least one electrical component. Furthermore, the bond layer is removed with the exception of a first part which is disposed beneath the part which is disposed beneath the contact layer on which the at least one conductor line and/or the at least one antenna element is embodied. Alternatively or additionally, the bond layer is removed with the exception of at least one second part which provides a defined distance from a support surface on the contact layer which is embodied for the support of at least one electrical component. This ensures that the optional electrical components can be positioned optimally and that the soldering means with which the electrical component is connected to the support surface does not flow away arbitrarily but is brought to a stop at the latest at the second part of the bond layer.

Furthermore, an advantage is achieved with the method according to the invention if the following method steps are implemented. In a further method step, the carrier substrate together with the second part of the bond layer and the contact layer is coated with solder-stop layer. Furthermore, the solder-stop layer is removed with the exception of the regions which are disposed at least partially on the second part of the bond layer and/or which are disposed in a region between the second part of the bond layer and the support surface and/or which are disposed at least partially on the support surface. This ensures that, in the case of the heating of the solder-stop layer during the soldering process, the means from which the solder-stop layer is formed does not flow away in all directions, but comes to a stop at the latest at the second part of the bond layer. As a result, very precise soldering processes can be realised.

Furthermore, the method according to the invention is particularly advantageous if the following method steps are implemented. In a further method step, the edge of the carrier substrate, that is, an outer region of the carrier substrate, is removed. In this context, the edge can be selected arbitrarily with regard to its dimensions. The dimensions of a carrier substrate capable of manufacture extend, for example, from 50 µm to 10 mm in width and 50 µm to 10 mm in length. The edge can provide, for example, a region from 600 µm to preferably 200 µm or by further preference less than 100 µm. In a further method step, the at least one sacrificial carrier accordingly exposed towards the exterior, that is, in the direction towards the contact layer, and the carrier substrate together with the bond layer and the contact layer are coated with a further bond layer and with a further contact layer.

In a subsequent preferred method step, the further bond layer and the further contact layer is removed from the regions on the carrier substrate on which no fastening elements for stabilisation are to be embodied. These regions include all regions which are not associated with the outer region of the carrier substrate. Finally, the further bond layer and the further contact layer are removed from the regions on the at least one sacrificial carrier on which no fastening elements are to be embodied with the exception of an edging the width of which is adjustable, wherein the edging surrounds all fastening elements with a defined distance and connects them to one another via at least one web.

The advantage that the fastening elements are applied to the carrier substrate using a deposition method is that the latter are permanently connected to the carrier substrate in a mechanically stable manner and at the same time allow a good thermal contact. The edging offers the advantage that the carrier substrate can be further processed in a particularly simple manner. In the further course, only the webs need to be cut through or respectively cut-off, in order to obtain a carrier substrate with the at least one fastening element. Such a carrier substrate can preferably have all possible shapes. In addition to a square shape or a rectangular shape, an L-shaped shape can also be provided. In every case, the edging encloses the shape of the carrier substrate.

Finally, a particular advantage is achieved with the method according to the invention if the following method steps are implemented. In a further method step, at least one region of the bond layer is coated with a contact layer before the contact layer is coated with the solder-stop layer and/or the further bond layer. Following this, at least the parts of the solder-stop layer and/or the further bond layer which are disposed above the region of the bond layer are coated with the further contact layer, thereby forming a capacitor, the level of which is adjusted via a thickness of the solder-stop layer and/or further bond layer and/or the size of the area of the region. In this context, it is particularly advantageous if the further contact layer is connected to the fastening element and if the contact layer forms the conductor line or the antenna element.

In the case of the substrate-based circuit, it is particularly advantageous that the latter provides a carrier substrate, wherein a bond layer is embodied on at least one part of the carrier substrate, and wherein a contact layer, which forms the at least one conductor line and/or at least one antenna element, is embodied on at least one part of the bond layer. In this context, the carrier substrate provides at least one fastening element which is deposited on the outer region of the carrier substrate and projects beyond the outer region of the carrier substrate. It is particularly advantageous in this context that a fastening element is connected in a mechanically stable manner to the carrier substrate through a deposition process, and that this fastening element projects beyond an outer region of the carrier substrate. This guarantees that the carrier substrate itself is mechanically stable and also that the carrier substrate does not crack under stress. At the same time, it is achieved that, via the projecting part of the fastening element, the carrier substrate can be very readily fitted within a hollow conductor.

The outer region in which the fastening element is deposited on the carrier substrate can be adjusted arbitrarily in this context. This outer region need not always provide the same dimensions. It preferably provides a wide shape from 600 µm to 200 µm, preferably less than 100 µm. The fastening element is preferably arranged parallel to the at least one conductor line which comprises the contact layer.

Furthermore, it is particularly advantageous if the at least one fastening element is formed from the same material from which the contact layer is also formed, and/or if, in the region in which the at least one fastening element is connected to the carrier substrate, a further bond layer is arranged between the at least one fastening element and the carrier substrate. This ensures that the fastening element is permanently connected to the carrier substrate in a mechanically stable manner, and that a good thermal contact is provided, so that surplus thermal energy can be very readily released to the environment via the at least one fastening element.

Furthermore, it is particularly advantageous if, in the case of the substrate-based circuit, at least a part of the contact layer is embodied as a support surface for the support of an electronic component, and/or if a second part of the bond layer is embodied at a defined distance from the support surface, and/or if at least part of the second part of the bond layer, and/or a region between the second part and the bond layer and the support surface, and/or a part of the support surface is provided with a solder-stop layer. This ensures that an electronic component can be aligned and soldered as accurately as possible. Furthermore, this ensures that the soldering means cannot flow away in all directions when heated, but that this means preferably comes to a stop at the solder stop or at the latest at the second part of the bond layer. This guarantees that a very accurate and reproducible soldered connection can be manufactured.

An advantage is also achieved with the substrate-based circuit if a contact layer is embodied on an area between the bond layer and the solder-stop layer, and if the further contact layer is embodied on a further area of the same size on the solder-stop layer or on the solder-stop layer and the further bond layer, wherein the further contact layer is connected in an electrically conducting manner to the at least one fastening element, and if the contact layer is connected in an electrically conducting manner to the at least one conductor line or to the antenna element, thereby forming a capacitor. The fact that the solder-stop layer and/or the further bond layer is enclosed by the contact layer and the further contact layer thereby forming a capacitor which is adjustable through the thickness of the solder-stop layer and/or the further bond layer and/or through the size of the area is particularly advantageous because additional filters can be realised in this manner. This is achieved without the need to solder different discrete components onto the substrate-based circuit. In this context, the capacitance can be adjusted very accurately and in a reproducible manner.

Furthermore, an advantage is achieved with the hollow conductor which such a substrate-based circuit, because the hollow conductor is formed from two hollow-conductor segments rigidly connected to one another, wherein each hollow-conductor segment provides a groove, and wherein the at least one fastening element is rigidly clamped between the two segments, so that the substrate-based circuit is arranged centrally within the hollow conductor formed by the two grooves. This ensures that the substrate-based circuit on which the microwave signals are guided is always held in the same spatial position within the hollow conductor, so that the microwave signals can be propagated in an optimal manner. The fastening elements themselves are squeezed between the two segments so that no mechanical play is possible, thereby making possible a very simple assembly, wherein, at the same time, the mechanical stability of the substrate-based circuit, especially of the carrier substrate, is guaranteed. Here, squeezed is understood to mean that the thickness of the squeezed part of the fastening element after the assembly process is less than before the assembly process.

Finally, an advantage is achieved with the hollow conductor according to the invention if at least one hollow-conductor segment provides a recess, wherein the recess is arranged perpendicular to the at least one antenna element, so that a microwave signal can be supplied to the at least one antenna element. In this manner, a microwave signal which is transported within a hollow conductor can be supplied very readily to the substrate-based circuit.

Figure 1B:
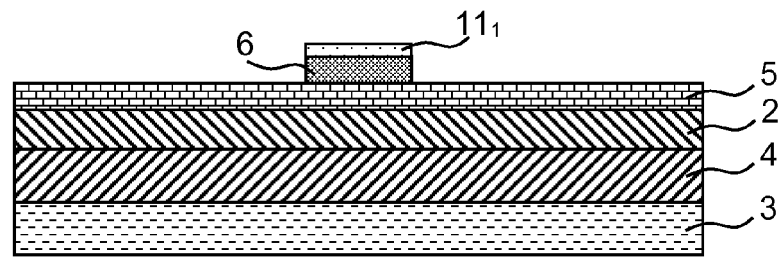
Figure 1C:
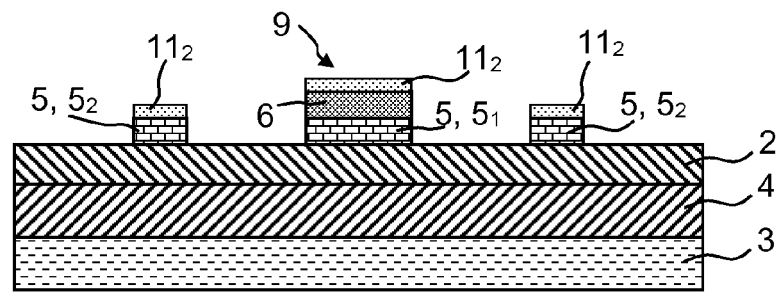
Figure 1D:
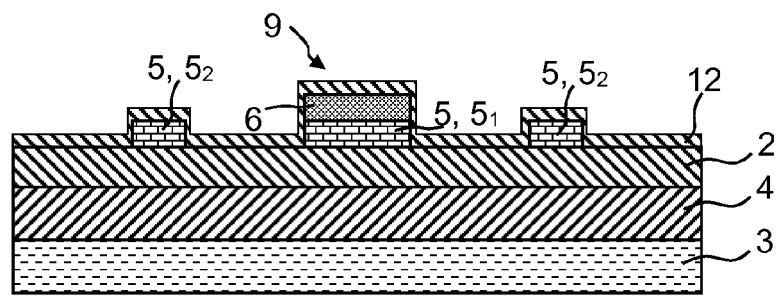
Figure 1E:
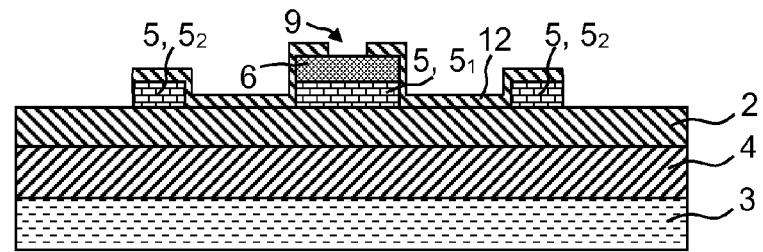
Figure 1F:
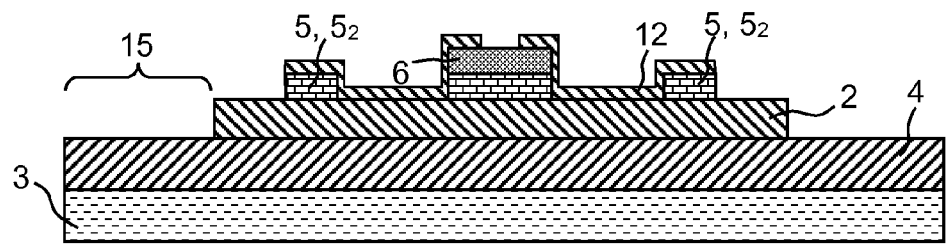
Figure 1G:
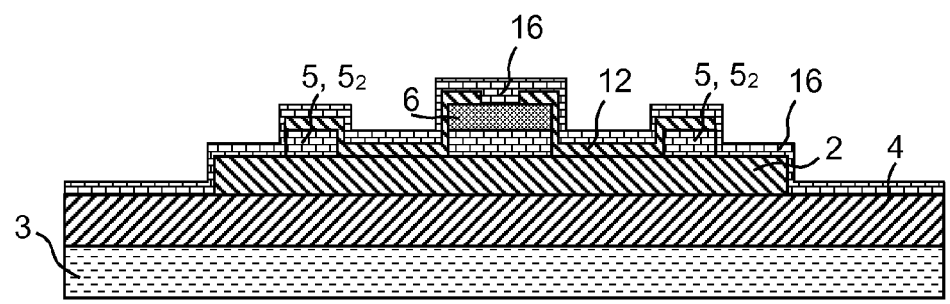
Figure 1H:
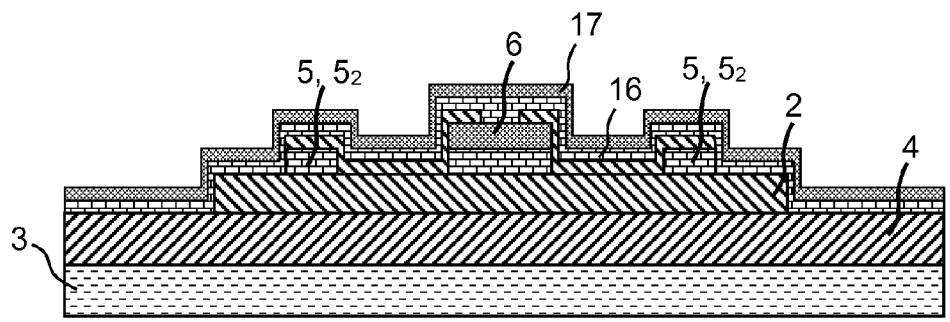
Figure 1I:
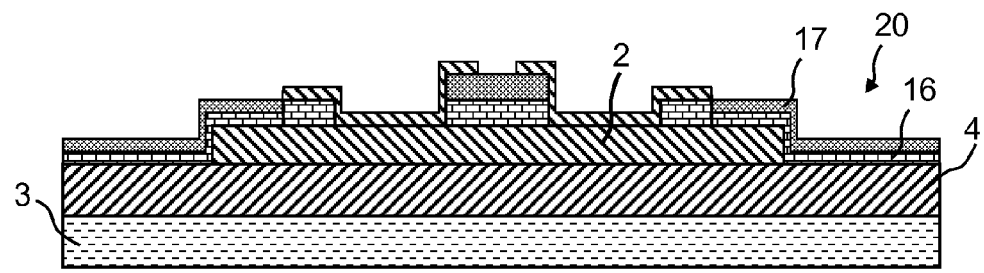
Figure 1J:
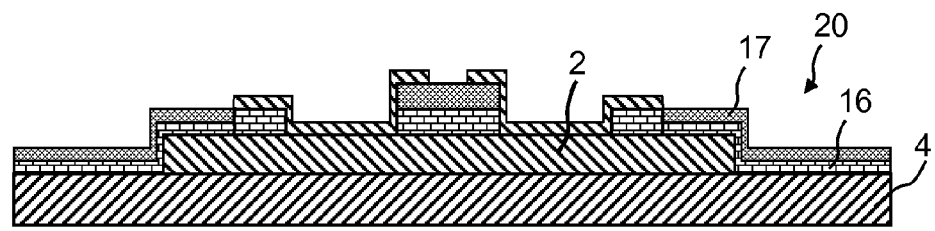
Figure 1K:
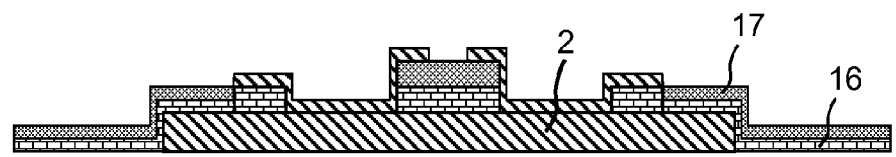
Figure 1L:
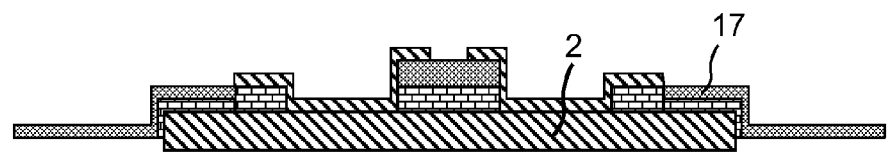
Figure 2A:
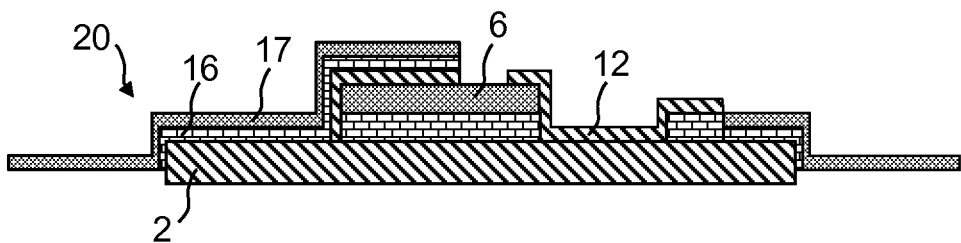
Figure 2B:
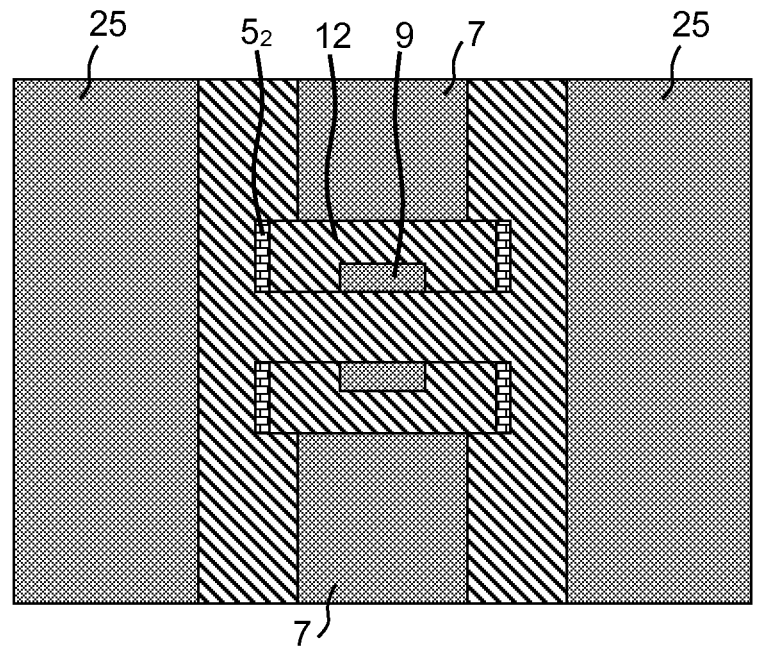
Figure 3A:
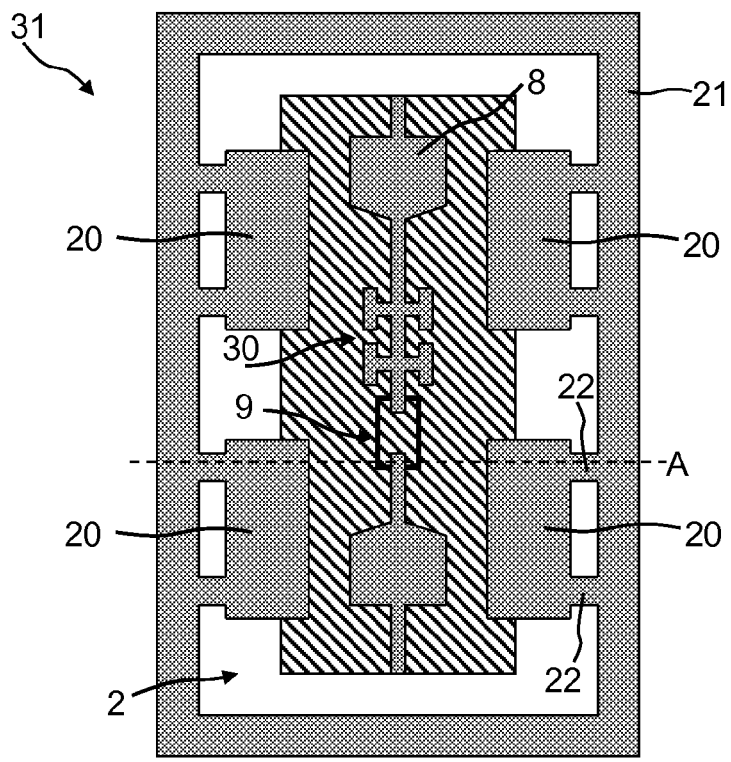
Figure 3B:
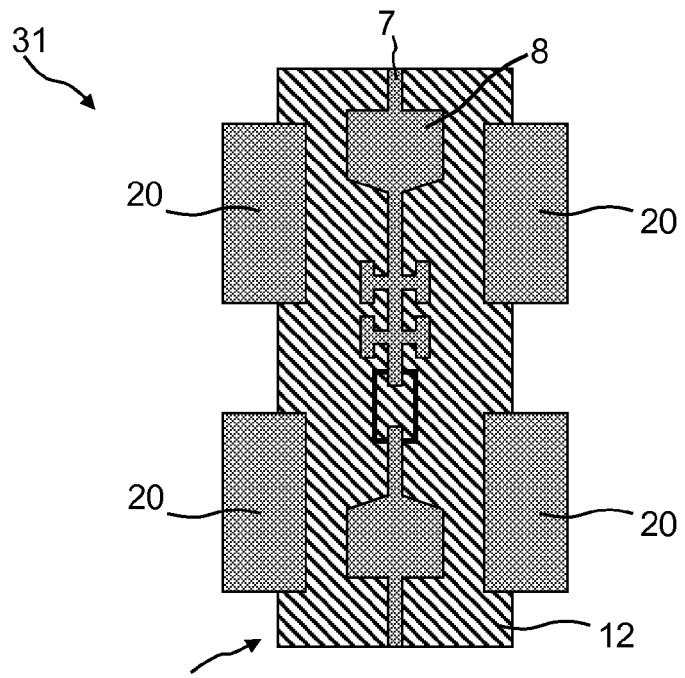
Figure 4A:
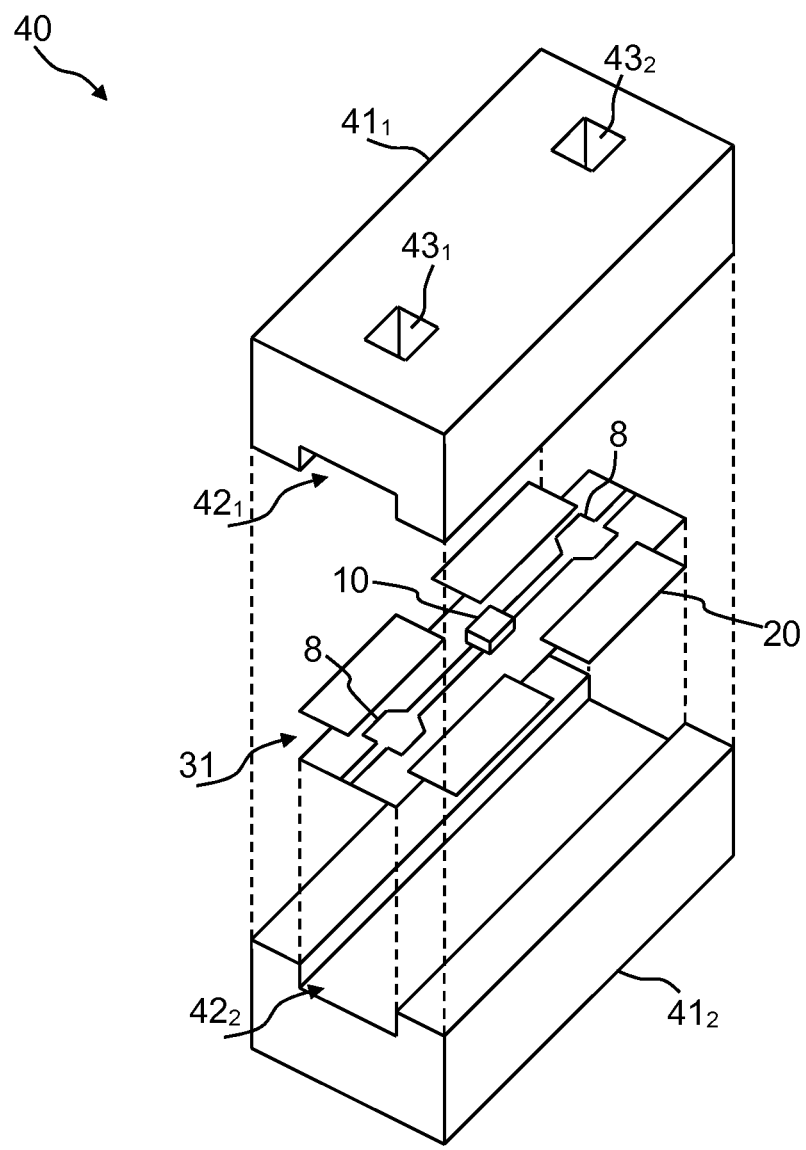
Figure 4B:
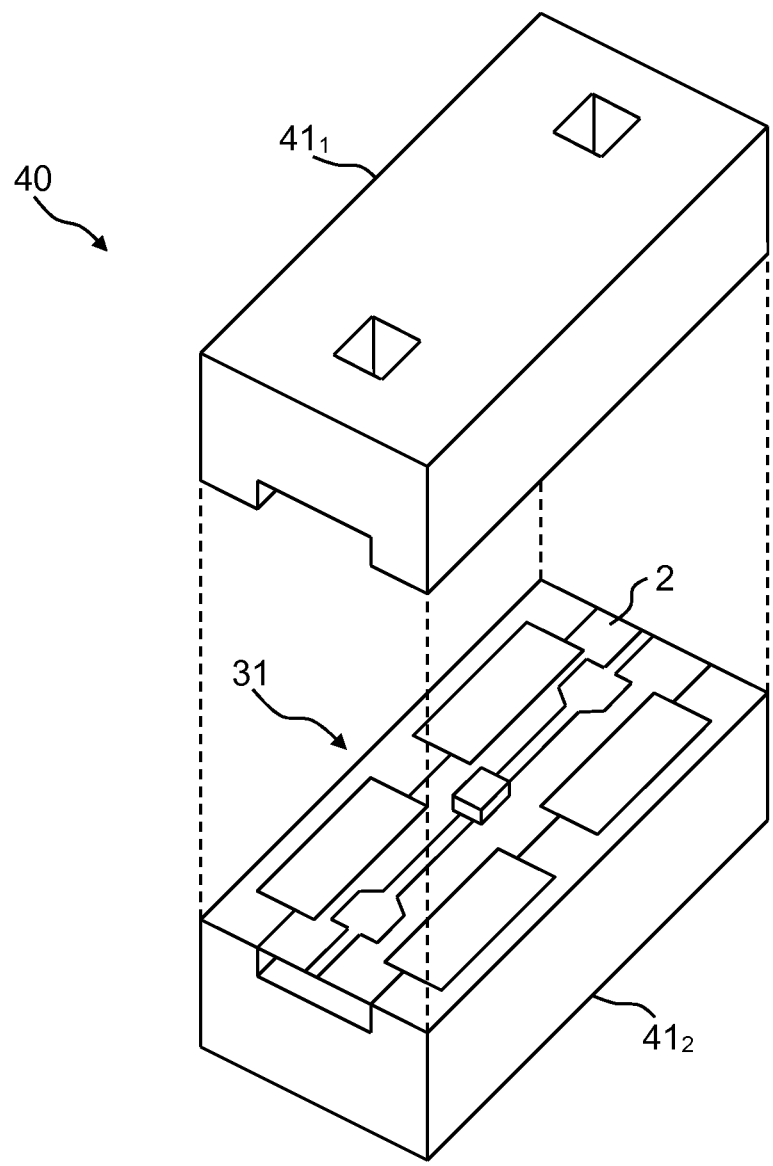
Figure 5A:
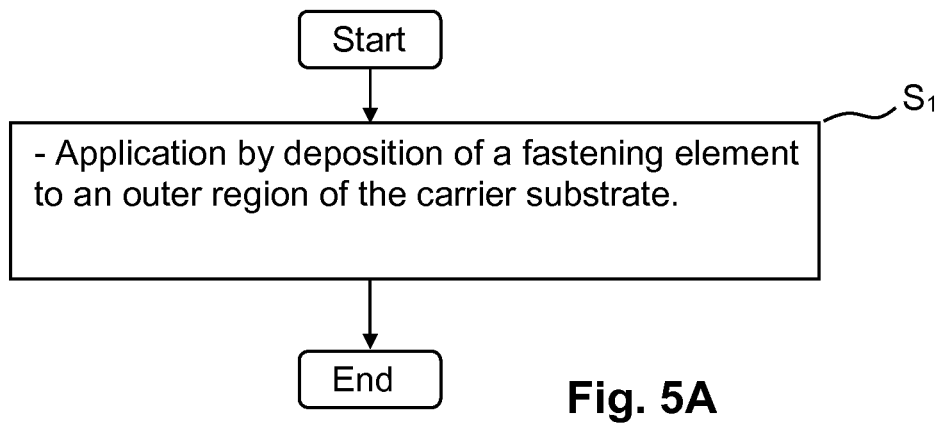
Figure 5B:
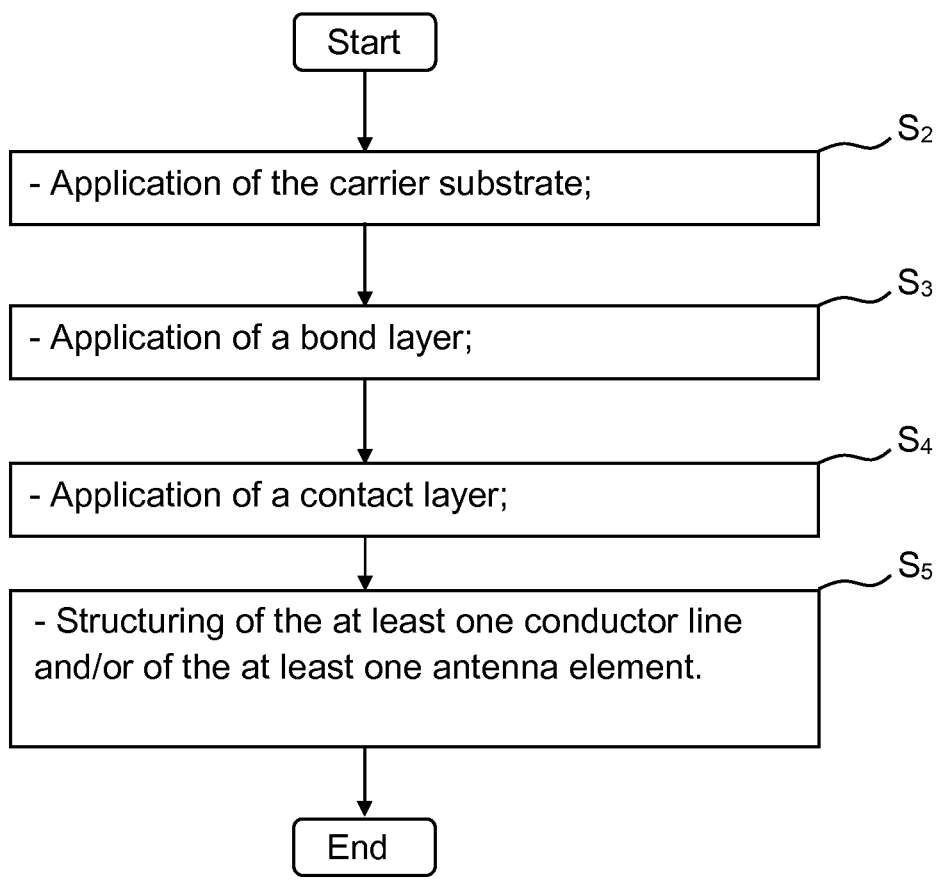
Figure 5C:
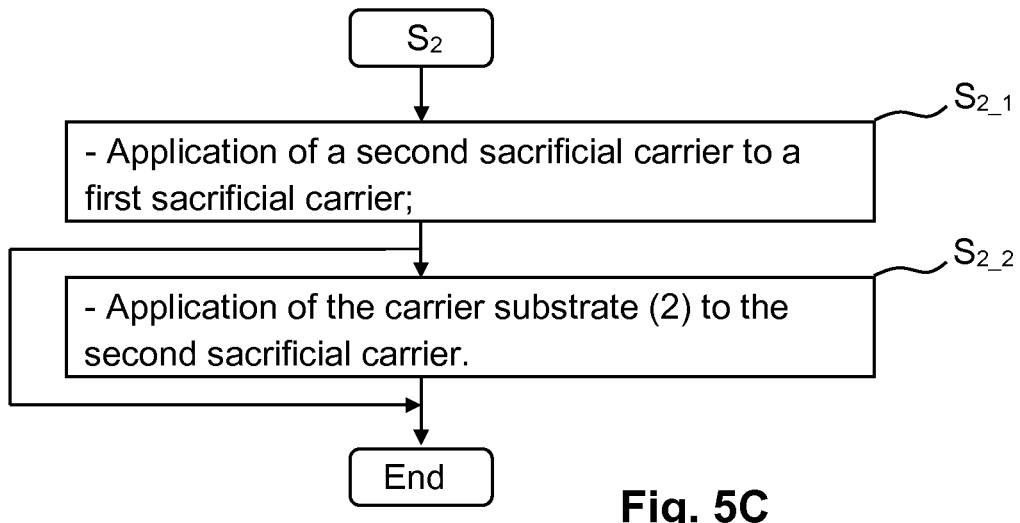
Figure 5D:
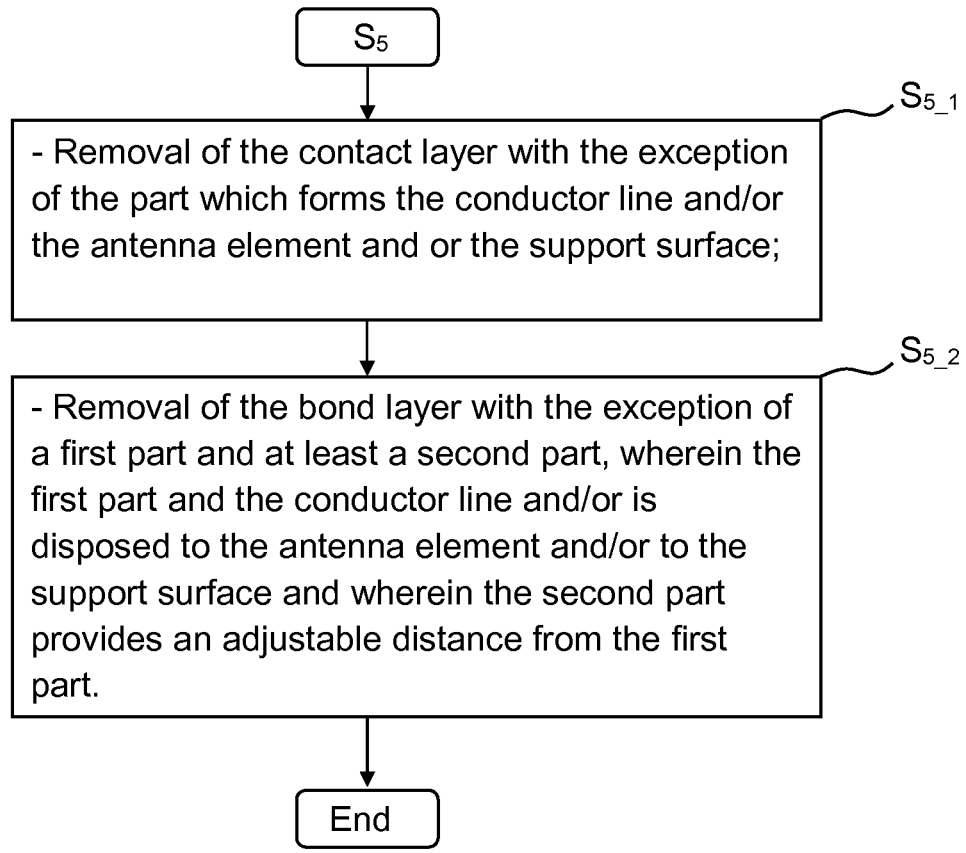
Figure 5E:
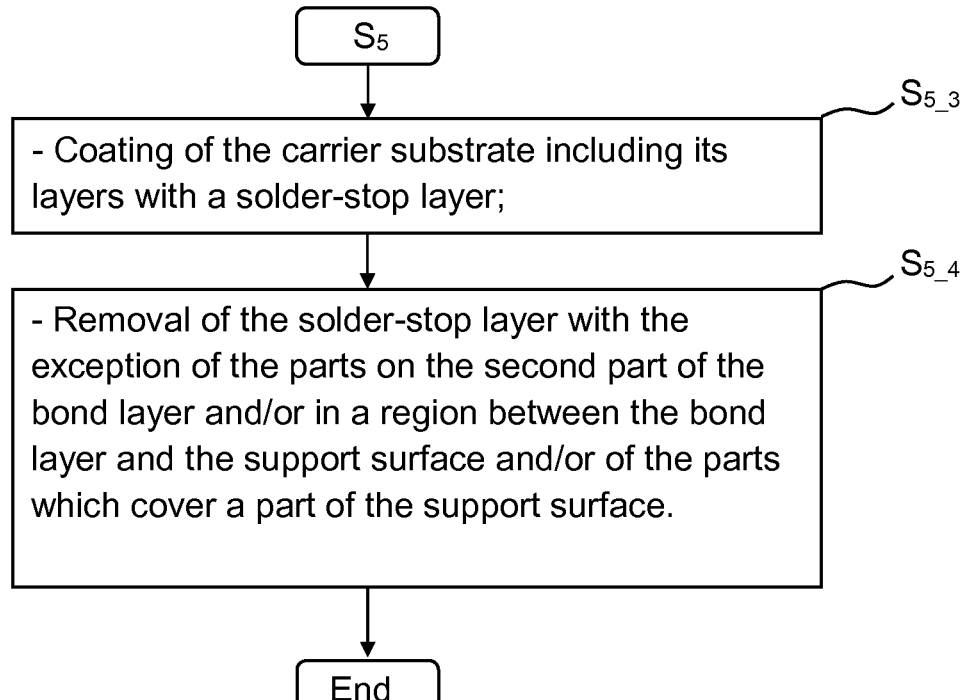
Figure 5F:
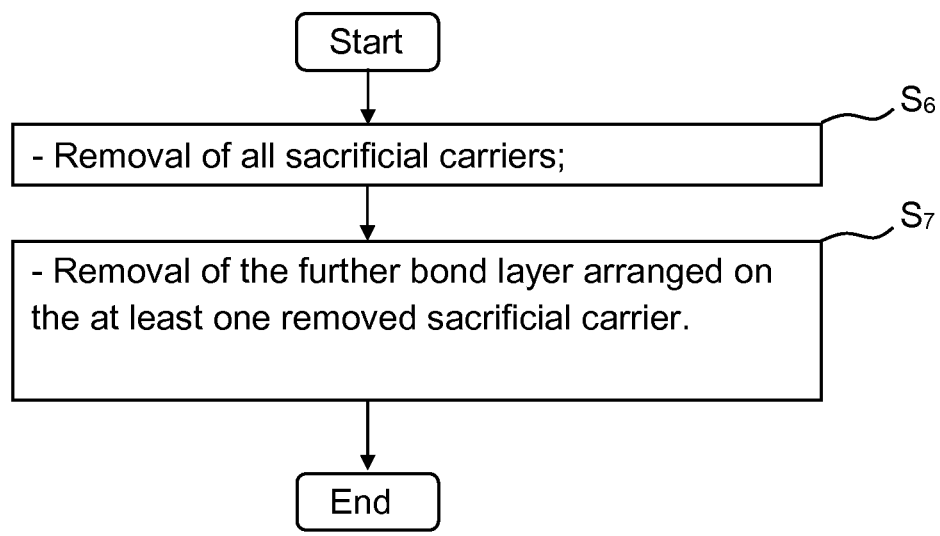
Figure 5G:
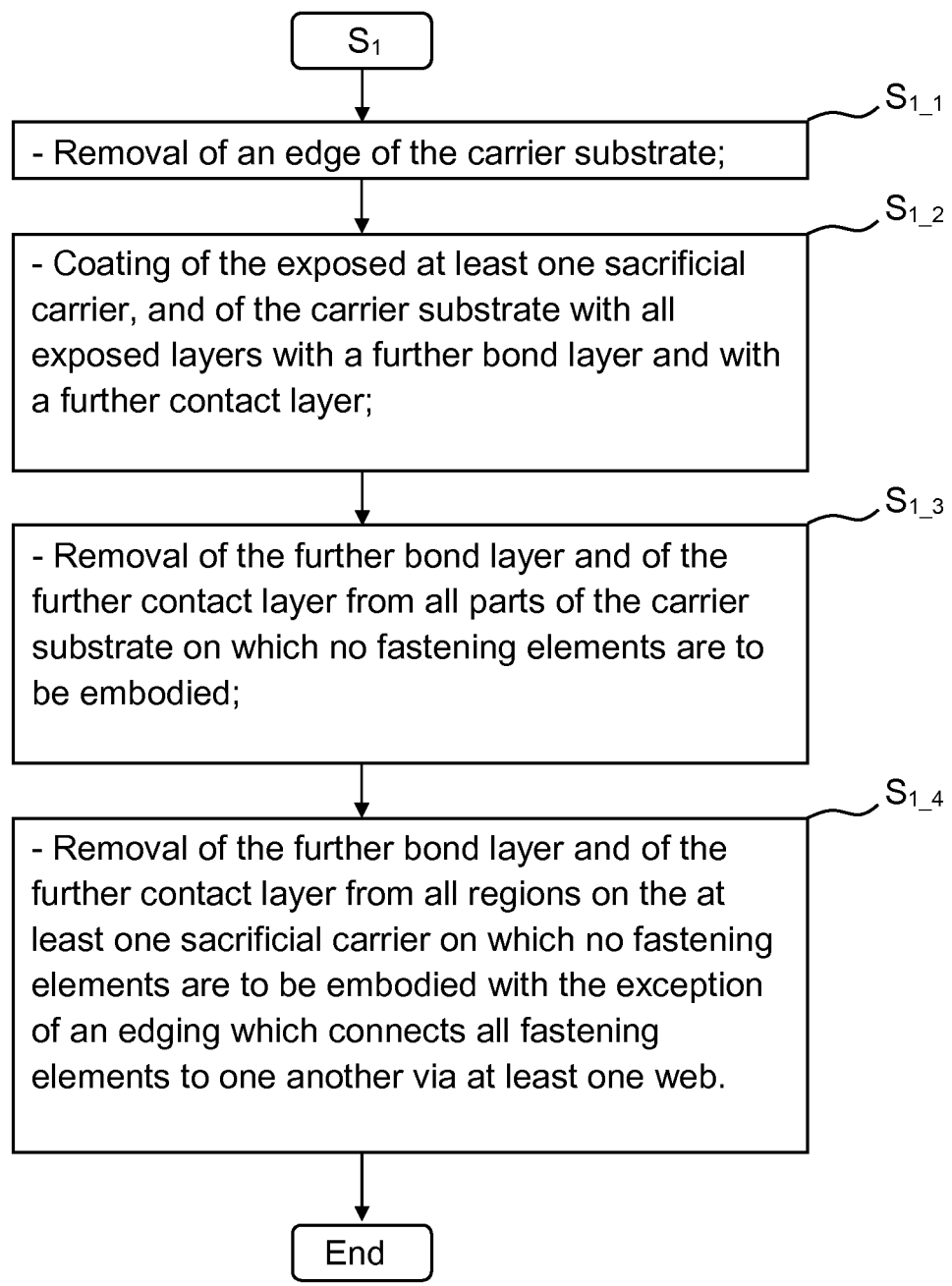
Figure 5H:
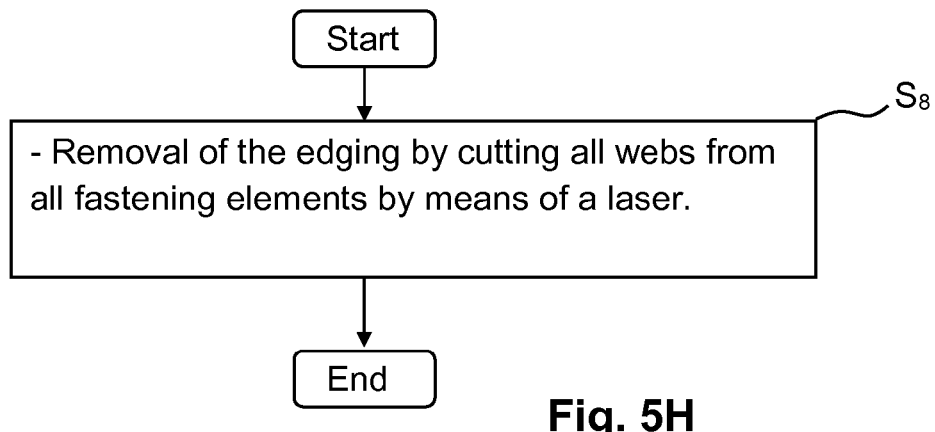
Figure 5I:
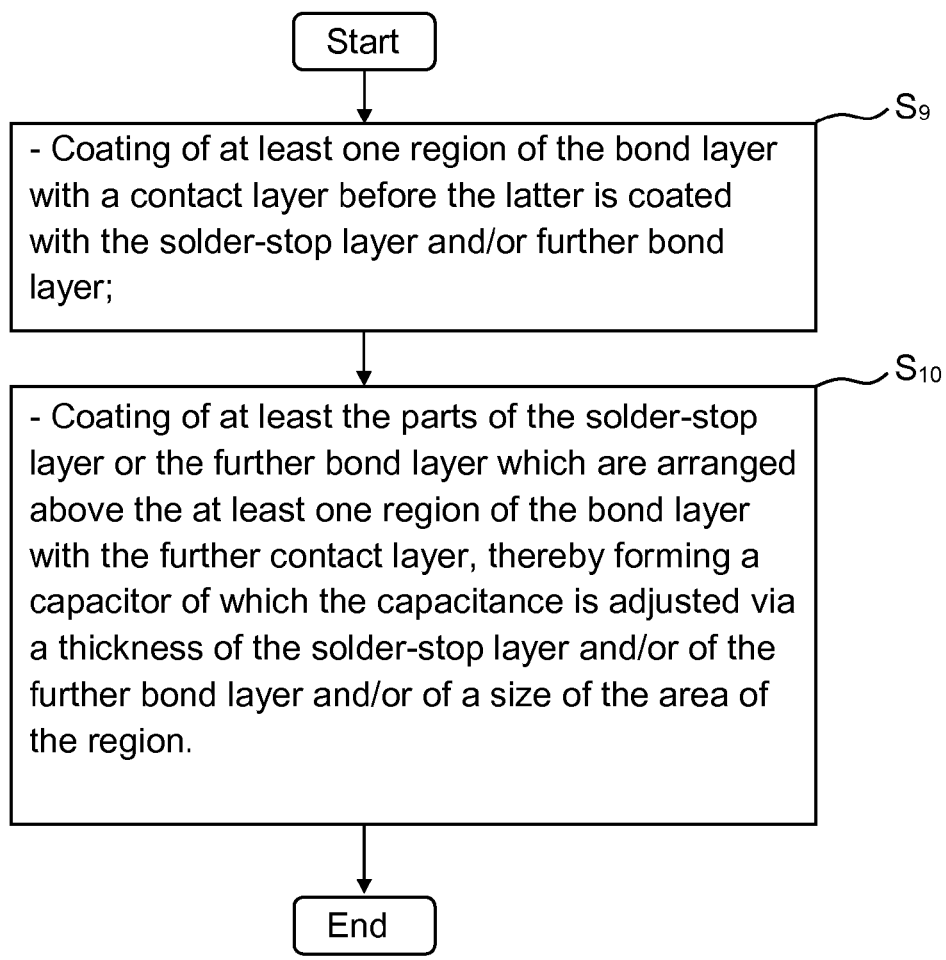

Different exemplary embodiments of the invention are described below by way of example with reference to the drawings. Identical subject matters provide the same reference numbers. In detail, the corresponding Figs. of the drawings show:

FIG. 1A an exemplary embodiment of a layer structure from which the carrier substrate according to the invention with a circuit arranged on it is created;

FIG. 1B the layer structure in which a contact layer is structured;

FIG. 1C the layer structure in which a bond layer exposed beneath the contact layer is structured;

FIG. 1D the layer structure in which the exposed contact layer, the partially exposed bond layer and a partially exposed carrier substrate are coated with a solder-stop layer;

FIG. 1E the layer structure in which the solder-stop layer is structured;

FIG. 1F the layer structure in which an outer edge of the carrier substrate is removed so that a second sacrificial carrier disposed beneath it becomes evident;

FIG. 1G the layer structure in which the exposed, second sacrificial carrier, the exposed carrier substrate, the exposed bond layer, the exposed contact layer and the externally disposed solder-stop layer are coated with a further bond layer;

FIG. 1H the layer structure in which the further bond layer is coated with a further contact layer;

FIG. 1I the layer structure in which the further bond layer and the further contact layer are structured in such a manner that the further bond layer and the further contact layer is preserved only at those positions in which the fastening elements are to be formed on the outer region of the carrier substrate and on the second sacrificial carrier, and at those positions at which the edging is to be formed on the second sacrificial carrier which combine all fastening elements with one another via webs;

FIG. 1J the layer structure in which a first sacrificial carrier has been removed;

FIG. 1K the layer structure in which a second sacrificial carrier has been removed;

FIG. 1L the layer structure in which at least one part of the bond layer arranged on the removed second sacrificial carrier has been removed;

FIG. 2A a further exemplary embodiment of the layer structure in which, between the contact layer and the further contact layer, a solder-stop layer and/or the further bond layer are enclosed, thereby embodying a capacitor;

FIG. 2B an exemplary embodiment of a plan view of the carrier substrate according to the invention with a conductor line and a support surface for an electrical component;

FIG. 3A a further exemplary embodiment of a plan view of the carrier substrate according to the invention with an applied circuit structure, which, alongside four fastening elements also shows an edging which connects together the four fastening elements in each case via two webs;

FIG. 3B an exemplary embodiment of a plan view of the carrier substrate according to the invention with an applied circuit structure, which provides four fastening elements of which the webs have been cut by means of a laser;

FIG. 4A an exemplary embodiment of a three-dimensional view of a hollow conductor according to the invention which comprises two segments into which the carrier substrate according to the invention with the applied circuit structure is inserted;

FIG. 4B a further exemplary embodiment of another three-dimensional view of the hollow conductor according to the invention which comprises two segments into which the carrier substrate according to the invention with the applied circuit structure is inserted;

FIG. 5A an exemplary embodiment of a flow chart for the method according to the invention for manufacturing the carrier substrate;

FIG. 5B a further exemplary embodiment of a flow chart for the method according to the invention which explains the construction of the layer structure;

FIG. 5C a further exemplary embodiment of a flow chart for the method according to the invention which explains the construction of the layer structure;

FIG. 5D a further exemplary embodiment of a flow chart for the method according to the invention which explains the structuring of the circuit;

FIG. 5E a further exemplary embodiment of a flow chart for the method according to the invention which explains the passivation of the surface in the proximity of a support surface;

FIG. 5F a further exemplary embodiment of a flow chart of the method according to the invention which explains the removal of sacrificial carriers;

FIG. 5G a further exemplary embodiment of a flow chart for the method according to the invention which explains the manufacture of fastening elements;

FIG. 5H a further exemplary embodiment of a flow chart of the method according to the invention which explains the cutting out of the substrate-based circuit; and FIG. 5I a further exemplary embodiment of a flow chart for the method according to the invention which explains the manufacture of a capacitor on a substrate layer.

FIG. 1A shows a layer structure 1 from which the carrier structure 2 according to the invention with a circuit arranged on it is built up. The layer structure 1 comprises a conventional wafer which is preferably made of silicon (Si). The Si layer is preferably a first sacrificial layer 3, as will be explained later in the description. In this context, the silicon wafer can provide a size of, for example, 2 inches or larger.

A second sacrificial layer 4 is preferably applied to the first sacrificial layer 3. The second sacrificial layer 4 preferably comprises silicon oxide ($SiO_2$). The subsequently free-standing carrier substrate 2 is applied to the second sacrificial layer 4. The carrier substrate 2 is preferably silicon nitride ($Si_3N_4$) or diamond. In this context, the selection of the respective material is defined in particular by the concrete electrical, thermal and mechanical requirements.

A bond layer 5 is applied to the carrier substrate 2. This bond layer 5 preferably comprises titanium (Ti) or titanium tungsten (TiW) and/or chromium (Cr). The bond layer can be applied, for example, by a deposition process. Following this, a contact layer 6 is applied to the bond layer 5. The contact layer 6 is preferably made of gold.

The thickness of the contact layer 6 is, for example, 100 nm to 500 nm. The thickness of the bond layer is preferably 10 nm to 50 nm. The thickness of the carrier substrate is preferably 1 μm to 20 μm, by further preference 5 μm to 20 μm. The carrier substrate 2 is therefore significantly thinner than the conventional ceramic circuit carriers or the individual layers of a printed-circuit board which each comprise individual foils glued to one another. The layer thickness for the first sacrificial carrier 3 and the second sacrificial carrier 4 is selected so that, as far as possible, the processing takes place in a manner not susceptible to faults.

In this context, the layer structure 1 itself can adopt an arbitrary shape. Conceivable shapes are, for example, rectangles, squares or L-shaped formations, however, circular or elliptical segments can also be realised. There are also no limits to the length and the breadth of the layer structure 1 from which the carrier substrate 2 is subsequently made.

FIG. 1B shows the layer structure in which the contact layer 6 is structured. It is clearly evident that the contact layer 6 has been removed with the exception of the part which forms the at least one conductor line 7 and/or the at least one antenna element 8 or the part which is formed as a support surface 9 for at least one electrical component 10. The contact layer 6 is structured in this context by means of photolithography and wet-chemical etching steps. Residues of a photo-paint $11_1$ on the part of the contact layer 6 which has not been removed are still clearly evident.

FIG. 1C shows the layer structure 1 in which a bond layer 5 exposed beneath the contact layer 6 is structured. In this context, the bond layer 5 is removed with the exception of a first part $5_1$, which is disposed beneath the part of the contact layer 6 on which the at least one conductor line 7 and/or the at least one antenna element 8 is formed. Furthermore, the part of the bond layer 5 can optionally be removed with the exception of at least one second part $5_2$ which provides a defined distance from a support surface 9 on the contact layer 6, which is embodied for the support of at least one electrical component 10. The second part $5_2$ of the bond layer 5 in this context represents the adhesive connection with a solder-stop layer or the dielectric of a capacitor, as will be explained in the following.

A photo-paint $11_2$ which is disposed on the second part $5_2$ of the bond layer 5 and on the other remaining contact layer 6 is also clearly evident. This photo-paint $11_2$ can be readily washed away in due course. The use of other photo-paints has not been further illustrated for reasons of improved visual clarity in the remaining structuring steps. The carrier substrate 2 and the first and second sacrificial carrier 3, 4 remain unchanged.

FIG. 1D shows the layer structure 1 in which the exposed contact layer 6, the partially exposed bond layer 5 and a partially exposed carrier substrate 2 have been coated with a solder-stop layer 12. In this context, the carrier substrate 2 together with the second part $5_2$ of the bond layer 5 and the contact layer 6 is coated with the solder-stop layer 12. Such a solder-stop layer, which is also referred to as a solder-stop paint, serves, on the one hand, for protection from corrosion and mechanical damage and, on the other hand, during soldering, prevents the wetting of the surfaces on the printed-circuit board coated with it with soldering tin. The solder-stop layer therefore preferably comprises $Si_3N_4$ and provides a thickness from, for example, 500 nm to, for example, 1500 nm. As will be explained later, different materials and different thicknesses are also possible, in particular, for the adjustment of a capacitance.

FIG. 1E shows the layer structure 1 in which the solder-stop layer 12 has been structured. In this context, the solder-stop layer 12 has been removed with the exception of the regions which are disposed at least partially on the second part $5_2$ of the bond layer 5 and/or which are disposed in a region between the second part $5_2$ of the bond layer 5 and the support surface 9 and/or which are disposed at least partially on the support surface 9. In the example from FIG. 1E, it is clearly evident that the solder-stop layer 12 has been partially removed in the region of the support surface 9. This allows the rigid soldering of an electrical component 10 to the support surface 9. It is also clearly evident that the regions between the second part $5_2$ of the bond layer 5 and the support surface 9 are lower and form a kind of indentation which subsequently serves to receive the material of the solder-stop layer 12 liquefied through the soldering process, so that the electrical component 10 can be rigidly soldered in an optimal manner.

For the case that no solder barriers in the form of a second part $5_2$ of the bond layer 5 are required, these can also be omitted. This is possible, in particular, alongside the contact layer 6 embodied as conductor line 7 or alongside the contact layer 6 embodied as an antenna element 8. In this case, the at least one conductor line 7 and/or the at least one antenna element 8 is preferably completely covered with the solder-stop layer 12, which leads to a passivation of the surface and protects from corrosion. Even if, for reasons of compactness, FIG. 1E shows an application of the $Si_3N_4$ solder-stop layer 12 to the $Si_3N_4$ carrier substrate 2, a further separating layer, which is not illustrated and has already been removed in FIG. 1E, is disposed between the two layers.

It has not been shown that the support surface 9 not covered by the solder-stop layer 12 can be filled up again through the application of an additional contact layer, which is also preferably made of gold, in such a manner that the height of the support surface 9 corresponds to the height of the solder-stop layer 12, so that the electrical component 10 can be aligned and soldered in an optimal manner. The carrier substrate 2 and the first and second sacrificial carrier 3, 4 have not been changed in FIG. 1E.

FIG. 1F shows the layer structure 1, in which an external edge 15 of the carrier substrate 2 has been removed, so that a second sacrificial layer 4 disposed beneath it comes into view. The width of the edge 15 in this context can be selected arbitrarily. By preference, the edge 15 is disposed on all sides of the carrier substrate 2, independently of the shape ultimately adopted by the carrier substrate 2. The width of the edge can be, for example, less than 1 mm or less than 700 µm or less than 500 µm.

FIG. 1G shows the layer structure 1 in which the exposed second sacrificial carrier 4, the exposed carrier substrate 2, the exposed bond layer 5, the exposed contact layer 6 and the externally disposed solder-stop layer 12 are coated with a further bond layer 16. This further bond layer 16 is preferably selected from one of the materials from which the bond layer 5 is made. Accordingly, the further bond layer 16 provides the same hatching as the bond layer 5. Materials for the further bond layer 16 can include, for example, titanium, titanium tungsten or chromium.

FIG. 1H shows the layer structure 1 in which the further bond layer 16 is coated with a further contact layer 17. This further contact layer 17 preferably comprises the same material from which the contact layer 6 is already made. By preference, the further contact layer 17 is therefore made of gold. The thickness of the further bond layer 16 is disposed within a range from 10 nm to 50 nm. The thickness of the further contact layer 17 is disposed within a range from, for example, 500 nm to 3 µm. This range is adjustable. In the drawings, the transitions between these further layers are illustrated abruptly. In reality, the transitions are gently rounded transitions.

FIG. 1I shows the layer structure 1 in which the further bond layer 16 and the further contact layer 17 are structured in such a manner that the further bond layer 16 and the further contact layer 17 remain only at the positions at which the fastening elements 20 are to be formed on the outer region of the carrier substrate 2 and on the second sacrificial carrier 4 and at the positions at which the edging 21, which connects all of the fastening element 20 via webs 22, is to be formed. Accordingly, the further bond layer 16 and the further contact layer 17 also remain at those positions which subsequently form the webs 22. A corresponding construction is shown in FIG. 3A and will be explained later. It is also possible that, in a first step, only the further contact layer 17 is removed, whereas the further bond layer 16 is removed in a subsequent step. The removal of the further contact layer 17 and of the further bond layer 16 is achieved by means of photolithography and wet chemical etching steps.

FIG. 1J shows the layer structure 1 in which a first sacrificial carrier 3 has been removed. The first sacrificial carrier 3 which preferably comprises silicon, can be removed by undercutting, for example, by means of potassium hydroxide at a temperature of, for example, 80° C.

FIG. 1K shows the layer structure 1 in which a second sacrificial carrier 4 has been removed. Accordingly, all sacrificial carriers 3 and 4 have been removed.

FIG. 1L shows the layer structure 1 in which at least a part of the bond layer 16 arranged on the removed second sacrificial carrier 4 has been removed. A plan view of the layer structure 1 as illustrated in FIG. 1, which will be explained in greater detail below, is shown in FIG. 3A.

FIG. 2A shows the layer structure 1 in which a capacitor or respectively a condenser is embodied through the contact layer 6 and the further contact layer 17, between which the solder-stop layer 12 and/or the further bond layer 16 are enclosed. For this purpose, in FIG. 1C, the contact layer 6 is preferably left on the second part $5_2$ of the bond layer 5, and it is ensured that the contact layer 6 is also connected in an electrically conducting manner via the second part $5_2$ of the bond layer 5 to the part of the contact layer 6 which forms the conductor line 7. In the exemplary embodiment from FIG. 2A, there is therefore no interruption between the first part $5_1$ of the bond layer 5 and the second part $5_2$ of the bond layer 5. Following this, the solder-stop layer 12 is applied correspondingly, as shown in FIG. 1D and in FIG. 1E. In the further course, the further bond layer 16 can then be applied over the solder-stop layer 12, wherein the further contact layer 17 is applied to the further bond layer 16, thereby forming a capacitor. The capacitor is formed between the mutually overlapping area of the contact layer 6 and the further contact layer 17. The level of the capacitance can be adjusted through the size of the mutually overlapping area and/or through the thickness of the dielectric which is formed by the solder-stop layer 12 and/or the further bond layer 16 between the contact layer 6 and the further contact layer 17.

In this case, the further contact layer 17 is connected in an electrically conducting manner to the fastening element 20. As will be explained in greater detail later, the contact layer 6 forms the at least one conductor line 7 and/or the at least one antenna element 8.

FIG. 2B shows a plan view of the carrier substrate 2 with a conductor line 7 and a support surface 9 for an electrical component 10. It is clearly evident that the support surface 9 is surrounded by a solder-stop layer 12, which ensures that the soldering means (for example, soldering tin) does not flow away in uncontrolled tracks, so that reproducible solder pads can be obtained. The conductor line 7 can provide a structural width of, for example, less than 50 µm, by preference, less than 20 µm. The support surface is therefore not true to scale.

The effect of the bond layer as a solder-stop does not occur as a mechanical barrier but by preventing a wetting/alloying with the gold of the contact layer. The second part $5_2$ of the bond layer 5 therefore functions as a solder barrier. The conductor line 7, which is formed by the contact layer 6 is electrically isolated from a further ground surface 25. The further ground surface 25 can also already be part of the fastening element 20.

FIG. 3A shows a plan view of an exemplary embodiment of the carrier substrate 2 according to the invention with an applied circuit structure, which, alongside four fastening elements 20, also shows an edging 21, which connects each of the four fastening elements to one another, for example, via two (or more or fewer) webs 22 in each case. It is clearly evident that the carrier substrate 2 provides a rectangular shape. Two fastening elements 20 are disposed respectively at two sides of the carrier substrate 2 in each case. These are preferably embodied parallel to the conductor line. FIGS. 1A to 1L show a section through the axis A. Each fastening element 20 is connected to an outer edging 21, in each case via two webs 22. The distance between the outer edging 21 and the carrier substrate 20 can be selected arbitrarily.

Two antenna elements 8 and the associated line structures are also clearly evident. Two filters 30 which filter the high-frequency microwave signal are thus also illustrated. The carrier substrate 2 can have any arbitrary shape. This shape is surrounded by an edging 21, as shown in FIG. 3A, wherein the edging 21 is connected to the carrier substrate 2 only via the fastening elements 20. The number of fastening elements 20 is not restricted to four, but can provide an arbitrary number. Dependent upon the thickness of the carrier substrate 2, more or fewer fastening elements are required. The shape and the width of the carrier substrate 2 also mean that a different number of fastening element 20 is required. The fastening elements 20 provide an excellent mechanical stability to the carrier substrate 2 which is preferably less than 20 µm thin. At the same time, the fastening elements 20 allow the removal of surplus thermal energy via the former to a corresponding heat sink, for example, in the form of a housing. This factual situation will be described in greater detail with reference to FIGS. 4A and 4B. The substrate-based circuit 31 which is illustrated in FIG. 3A is the end product of the steps described in FIGS. 1A to 1L.

FIG. 3B shows a plan view of an exemplary embodiment according to the invention of the carrier substrate 2 according to the invention with an applied circuit structure which provides four fastening elements 20, of which the webs 22 have been separated preferably by means of a laser. The substrate-based circuit 31, which has been formed through separation of the frame 21, that is, of the edging 21, by means of cutting through the webs 22 from FIG. 3A, is clearly evident. The support surface 9 in this context can already be fitted with the electronic component 10 before the cutting through of the webs 22 by means of the laser. However, it is also possible for the electronic component 10 to be fitted only when the webs 22 and the edging 21 have already been removed.

The region of the conductor line 7 which is disposed at the edge of the substrate-based circuit 31 can be used for the purpose of supplying a bias (English: BIAS) to the substrate-based circuit 31.

The carrier substrate 2 in the substrate-based circuit 31 in FIG. 3B is clearly evident, wherein the carrier substrate 2 is coated with a solder-stop layer 12. However, before this, a bond layer 5 is embodied on the carrier substrate 2, wherein a contact layer 6 which forms at least one conductor line 7 and/or at least one antenna element 8 is embodied on at least one first part $5_1$ of the bond layer 5. In this context, the carrier substrate 2 provides at least one fastening element 20, which is deposited on the outer region of the carrier substrate 2 and projects beyond the outer region of the carrier substrate 2. In this context, deposited is understood to refer to a mechanically stable, non-detachable connection, as has been described in FIGS. 1A to 1L. The deposition can be implemented, for example, through a physical PVD or chemical CVD process. The fastening elements 20 can be further reinforced through a galvanic process. In this context, the outer region of the carrier substrate 2 is freely selectable. By preference, the outer region is smaller than 300 µm, by particular preference smaller than 200 µm or even smaller than 100 µm.

The frequencies of the microwave signal which is coupled via at least one antenna element 1 to the substrate-based circuit 31 is, for example, at least 100 GHz and extends, for example, up to 2 THz.

The at least one fastening element 20 is preferably formed, in this context, from the same material from which the contact layer 6 is made. This material is preferably gold. The region in which the at least one fastening element 20 is connected to the carrier substrate 2 further comprises a further bond layer 16 which is arranged between the carrier substrate 2 and the fastening element 20.

Furthermore, it is clearly evident that at least one part of the contact layer 6 is embodied as a support surface 9 for the support of an electronic component 10. As already explained, a second part $5_2$ of the bond layer 5 is disposed at a defined distance, which is adjustable, from the support surface 9, wherein at least a part of the second part $5_2$ of the bond layer 5 is provided with a solder-stop layer 12. The region between the second part $5_2$ of the bond layer 5 and the support surface 9 is also provided with a solder-stop layer 12. Furthermore, the same applies for at least a part of the support surface 9. It is also possible for a contact layer 6, 17 to be embodied on an area between the bond layer 5 and the solder-stop layer 12, wherein the second part $5_2$ or a further part of the bond layer 5 is preferably used, and for a contact layer 6, 17 also to be embodied on a further area of equal size on the solder-stop layer 12, wherein the two contact layers 6, 17 are not connected to one another in an electrically conducting manner and are connected to the at least one fastening element 20 or to the at least one conductor line 7, thereby forming a capacitor. The level of the capacitance can be adjusted through the thickness of the solder-stop layer 12 and the area of the structured contact layers 6, 17.

FIG. 4A shows a three-dimensional view of an exemplary embodiment of a hollow conductor 40 according to the invention, which is made from two segments $41_1$, $41_2$, into which the carrier substrate 2 according to the invention, that is, the substrate-based circuit 31 with the applied circuit structure, is inserted. It is clearly evident that the hollow conductor 40 is formed from two hollow-conductor segments $41_1$, $41_2$ capable of being connected rigidly to one another. In this context, a first hollow-conductor segment $41_1$ can be connected rigidly to a second hollow-conductor segment $41_2$ via a screw connection and/or welded connection, which is not illustrated. By preference, each hollow-conductor segment $41_1$, $41_2$ provides a groove $42_1$, $42_2$, wherein the at least one fastening element 20 is pressed between the two segments $41_1$, $41_2$, so that the substrate-based circuit 31 is arranged centrally within the hollow conductor 40 formed from the two grooves $41_1$, $41_2$. In this context, the depth of each groove $42_1$, $42_2$ can depend upon the respective operating frequency. The higher the operating frequencies are, the less deeply the grooves need to be embodied.

An electrical component 10 which is mounted on the support surface 9 and connected in an electrically conducting manner to the at least one electrical conductor line 7 is also clearly evident. The at least one electrical component 10 can be, for example, a mixer.

Furthermore, it is clearly evident that the substrate-based circuit 31 provides four fastening elements 20, wherein, by means of fastening element 20, a part projects beyond the edge of the carrier substrate 2. This part of each fastening element 20 which projects beyond the edge of the carrier substrate 2 is clamped between the two segments $41_1$, $41_2$ after these have been rigidly connected to one another. In this context, each groove $42_1$, $42_2$ is at least precisely as wide as the carrier substrate 2.

It is also clearly evident that at least one hollow-conductor segment $41_1$, $41_2$ provides at least one recess $43_1$, $43_2$, wherein the at least one recess $43_1$, $43_2$ is arranged perpendicular (or horizontally, not shown) relative to the at least one antenna element 8, wherein a microwave signal can accordingly be supplied to the at least one antenna element 8 via the at least one recess $43_1$, $43_2$. The at least one recess $43_1$, $43_2$ itself therefore forms a hollow conductor. The perpendicular alignment is illustrated, for example, by the dashed line. In this context, a microwave signal can be supplied to an antenna element 8, for example, via the first recess $43_1$. Via the antenna element 8, the microwave signal is coupled to the at least one conductor line 7 and is further processed by the electronic component 10 and, for example, stepped up in its frequency. Via the further antenna element 8, which is also connected in an electrically conducting manner to the electronic component 10, the microwave signal stepped up in its frequency can be guided out of the hollow conductor 40 via the second recess $43_2$.

Such a hollow conductor 40 can be used, for example, in order to generate radar signals which provide a very high-frequency for weather satellites.

FIG. 4B shows a further three-dimensional view of an exemplary embodiment according to the invention of the hollow conductor 40 according to the invention which is made from two segments $41_1$, $41_2$ into which the carrier substrate 3 according to the invention with the applied circuit structure is inserted. It is clearly evident how at least a part of the fastening elements 20 is supported on a surface of the second segment $41_2$ of the hollow conductor 40. Via this part of the fastening element 20, the substrate-based circuit is rigidly and, above all, stably held in a central position within the hollow conductor 40 formed after the connection of the two hollow-conductor segments $41_1$, $41_2$. As a result of the fact that both segments $41_1$, $41_2$ are rigidly connected to one another, an electrical contact with the housing ground of the hollow conductor 40 can also be provided via the connecting element 20. The hollow conductor 40 can thus serve as a heat sink in order to absorb surplus thermal energy.

It is also possible for the surface of the first hollow-conductor segment $41_1$ and the surface of the second hollow-conductor segment $41_2$, which are partially in contact and between which some of the fastening elements 20 are inserted, to provide a contour or respectively profile, wherein the contour or respectively the profile of the corresponding surface of the first hollow-conductor segment $41_1$ is inverse to the contour or respectively the profile of the corresponding surface of the second hollow-conductor segment $41_2$, so that the surface of the first hollow-conductor segment $41_1$ engages in the surface of the second hollow-conductor segment $41_2$ and vice versa. Accordingly, the fastening elements 20 are pressed together with the hollow conductor even more effectively.

FIG. 5A shows an exemplary embodiment of a flow chart for the method according to the invention. In a first method step $S_1$, at least one fastening element 20 is applied through a deposition process to an outer region of the carrier substrate 2, wherein the at least one fastening element projects beyond the outer region of the carrier substrate 2. For the deposition of the fastening element 20, all known deposition processes, such as PVD (English: physical vapour deposition; German: physikalische Vakuum-Abscheidung) and galvanisation are suitable. In this context, the fastening elements 20 are also referred to as beam leads.

FIG. 5B shows a further exemplary embodiment of a flow chart for the method according to the invention which explains in greater detail the construction of the layer structure 1. In a second method step $S_2$, the carrier substrate 2 is applied to at least one sacrificial carrier 3, 4. Following this, in method step $S_3$, a bond layer 5 is applied to the carrier substrate 2. Following this, in method step $S_4$, a contact layer 6 is formed on the bond layer 7 and/or the at least one antenna element 8. In a further method step $S_5$, the at least one conductor line 7 and/or the at least one antenna element 8 is structured. In this context, the carrier substrate 2 preferably comprises $Si_3N_4$ or diamond in the required thickness. The bond layer 5 preferably comprises titanium, titanium tungsten or chromium. The contact layer 6 is preferably made of gold. The conductor lines 7 preferably have a width of, for example, less than 50 µm, by further preference less than 20 µm. Method step $S_5$ is illustrated in FIGS. 1B and 1C.

FIG. 5C shows a further exemplary embodiment of a flow chart for the method according to the invention which explains the construction of the layer structure 1. By preference, the method step of applying the carrier substrate $S_2$ comprises the following sub-method steps. These include method step $S_{2\_1}$, which comprises the application of a second sacrificial carrier 4 to the first sacrificial carrier 3. Instead of method step $S_{2\_1}$ or in addition to method step $S_{2\_1}$, method step $S_{2\_2}$ can be implemented. In method step $S_{2\_2}$, the carrier substrate 2 is applied to the second sacrificial carrier 4. The first sacrificial carrier 3 is preferably silicon. The second sacrificial carrier 4 is preferably $SiO_2$.

FIG. 5D shows a further exemplary embodiment of a flow chart for the method according to the invention which explains the structuring of the circuit. Accordingly, the method step of structuring $S_5$ preferably comprises the method steps $S_{5\_1}$ and $S_{5\_1}$. In method step $S_{5\_1}$, the contact layer 6 is removed with the exception of the part which forms the at least one conductor line 7 and/or the at least one antenna element 8, or respectively the part which is embodied as a support surface 9 for at least one electrical component 10. This step is illustrated in FIG. 1D.

In method step $S_{5\_2}$, the bond layer 5 is removed with the exception of a first part $5_1$ which is disposed beneath the part of the contact layer 6 on which the at least one conductor line 7 and/or the at least one antenna element 8 is embodied. Alternatively or in addition to this, the bond layer 5 is removed with the exception of at least one second part $5_2$ which provides a defined distance from the support surface 9 on the contact layer 6 which is embodied to receive at least one electrical component 10. These steps are shown in FIG. 1C.

FIG. 5E shows a further exemplary embodiment of a flow chart for the method according to the invention which explains the passivation of the surface in the proximity of a support surface 9. For this purpose, method steps $S_{5\_3}$ and $S_{5\_4}$ are implemented within the method step of structuring $S_5$, preferably after the method step $S_{5\_2}$. In method step $S_{5\_3}$, the carrier substrate 2, together with the second part $5_2$ of the bond layer 5 and the contact layer 6, is coated with a solder-stop layer 12. This factual situation is illustrated in FIG. 1D.

In method step $S_{5\_4}$, the solder-stop layer 12 is removed with the exception of the regions which are disposed at least partially on the second part $5_2$ of the bond layer 5 and/or the regions which are disposed in a region between the second part $5_2$ of the bond layer 5 and the support surface 9 and/or the regions which are disposed at least partially on the support surface 9. This factual situation is illustrated in FIG. 1E.

FIG. 5F shows a further exemplary embodiment of a flow chart for the method according to the invention which explains the removal of the sacrificial carrier 3, 4. For this purpose, method steps $S_6$ and $S_7$ are implemented after the completion of method step $S_5$. In method step $S_6$, all sacrificial carriers 3, 4 are removed. The removal of the sacrificial carriers 3, 4 can be implemented by undercutting.

In method step $S_7$, the further bond layer 16 arranged on the at least one removed sacrificial carrier 3, 4 is removed. These factual situations are shown in FIGS. 1J, 1K and 1L.

FIG. 5G shows a further exemplary embodiment of a flow chart for the method according to the invention which explains the manufacture of the fastening elements 20. For this purpose, method steps $S_{1\_1}$, $S_{1\_2}$, $S_{1\_3}$ and $S_{1\_4}$ are implemented, preferably within method step $S_1$. In method step $S_{1\_1}$, an edge 15 of the carrier substrate 2 is removed. This method step is shown in FIG. 1F.

Following this, method step $S_{1\_2}$ is implemented. In method step $S_{1\_2}$, the at least one sacrificial carrier 3, 4 exposed in method step $S_{1\_1}$, together with the carrier substrate 2 which contains the bond layer 5 and the contact layer 6, is coated with a further bond layer 16 and with a further contact layer 17. The coating with the further bond layer 16 and with the further contact layer 17 is also a deposition process. These factual situations are explained in greater detail in FIG. 1G and FIG. 1H.

Following this, method step $S_{1\_3}$ is implemented. In method step $S_{1\_3}$, the further bond layer 16 and the further contact layer 17 is removed with the exception of the region on the carrier substrate 2 on which no fastening elements 20 for stabilisation are to be embodied. Furthermore, this factual situation is explained in greater detail in FIG. 1I.

Finally, following this, method step $S_{1\_4}$ is implemented. In method step $S_{1\_4}$, the further bond layer 16 and the further contact layer 17 is removed from the regions on the at least one sacrificial carrier 3, 4 on which no fastening elements 20 are to be embodied, with the exception of an edging 21 and at least one web 22 which surrounds all fastening elements 20 at a defined distance and connects them via at least one web 22. This factual situation also takes place in FIG. 1J but is not illustrated there, because FIG. 1J illustrates a simplified cross-section through the substrate-based circuit 1 along the axis A, as shown in FIG. 3A. The fastening elements 20 and also the edging 21 and the at least one web 22 are formed from the same material, namely on one side, from the further bond layer 16 and on the other side from the further contact layer 17 disposed above this.

FIG. 5H shows a further exemplary embodiment of a flow chart for the method according to the invention which explains the cutting out of the substrate-based circuit 31. For this purpose, method step $S_8$ is implemented, preferably after method step $S_7$. In method step $S_8$, the edging 21 is removed by means of a laser by cutting through the at least one web 22 at the transition to the corresponding fastening element 20. The substrate-based circuit 31 is accordingly detached from the edging 21 and from the webs 22. This factual situation is clearly evident in the transition from FIG. 3A to FIG. 3B.

FIG. 5I shows a further exemplary embodiment of a flow chart for the method according to the invention which explains the manufacture of a capacitor on a substrate layer 1. For this purpose, method steps $S_9$ and $S_{10}$, which can be implemented, for example, following method step $S_{5\_2}$ and $S_{5\_4}$, are implemented. Within method step $S_9$, at least one region of the bond layer 5 is coated with a contact layer 6 before the contact layer 6 is coated with the solder-stop layer 12 and/or the further bond layer 16 itself.

After the solder-stop layer 12 and/or the further bond layer 16 has been applied, method step $S_{10}$ is carried out. Within method step $S_{10}$, at least the parts of the solder-stop layer 12 and/or the further bond layer 16 which are arranged above the region of the bond layer 5 are coated with the further contact layer 17, thereby forming a capacitor the level of which is adjusted via a thickness of the solder-stop layer 12 and/or of the further bond layer 16 and/or the size of the area of the region. The area of the region is defined by the overlapping parts of the first contact layer 6 and the further contact layer 17. In this context, the further contact layer 17 can be connected, for example, to the at least one fastening element 20, as illustrated in FIG. 2A. Accordingly, the contact layer 6 is preferably connected in an electrically conducting manner to the conductor line 7 or the at least one antenna element 8.

Within the scope of the invention, all of the features described and/or illustrated can be combined arbitrarily with one another.

The invention claimed is:

1. A method for manufacturing a substrate-based circuit with a carrier substrate for being attached within a hollow conductor and with at least one conductor line and/or at least one antenna element arranged respectively on the carrier substrate, the method comprising:
    applying, by deposition, at least one fastening element to an outer region of the carrier substrate, the at least one fastening element projecting beyond the outer region of the carrier substrate; and
    attaching the carrier substrate to and within the hollow conductor.

2. The method according to claim 1, further including:
    applying the carrier substrate to at least one sacrificial carrier;
    applying a bond layer to the carrier substrate;
    applying, to the bond layer, a contact layer from which the at least one conductor line and/or the at least one antenna element is formed; and
    structuring the at least one conductor line and/or the at least one antenna element.

3. The method according to claim 2, wherein the applying the carrier substrate includes:
    applying a second sacrificial carrier to a first sacrificial carrier; and/or
    applying the carrier substrate to the second sacrificial carrier.

4. The method according to claim 2, wherein the structuring includes:
    removing the contact layer except for a part on which the at least one conductor line and/or the at least one antenna element is formed, or a part which is embodied as a support surface for at least one electrical component;
    removing the bond layer except for a first part which is disposed beneath the part of the contact layer on which the at least one conductor line and/or the at least one antenna element is formed; and/or
    removing the bond layer except for at least one second part which provides a defined distance from the support surface on the contact layer which is embodied for the support of the at least one electrical component.

5. The method according to claim 4, wherein the structuring further includes:
    coating the carrier substrate together with the at least one second part of the bond layer and the contact layer with a solder-stop layer; and
    removing the solder-stop layer except for regions which are disposed at least partially on the at least one second part of the bond layer and/or which are disposed in a region between the at least one second part of the bond layer and the support surface and/or which are disposed at least partially on the support surface.

6. The method according to claim 2, wherein the applying by deposition includes:
removing an edge of the carrier substrate, thereby exposing a portion of the at least one sacrificial carrier;
coating the exposed portion of the at least one sacrificial carrier and the carrier substrate having the bond layer and the contact layer thereon with a further bond layer and with a further contact layer;
removing the further bond layer and the further contact layer from regions on the carrier substrate on which no fastening elements for stabilization are to be embodied; and
removing the further bond layer and the further contact layer from regions on the at least one sacrificial carrier on which no fastening elements are to be embodied except for an edging which surrounds the at least one fastening element at a defined distance and connects the at least one fastenings element via at least one web.

7. The method according to claim 6, further including:
removing the at least one sacrificial carrier; and
removing a portion of the further bond layer that was coated on the at least one sacrificial carrier.

8. The method according to claim 7, further including:
removing the edging by cutting with a laser through the at least one web of the at least one fastening element.

9. The method according to claim 5, further including:
coating at least one region of the bond layer with the contact layer before the contact layer is coated with the solder-stop layer and/or a further bond layer; and
coating at least parts of the solder-stop layer or of the further bond layer which are arranged above the at least one region of the bond layer with a further contact layer, thereby forming a capacitor,
wherein a capacitance of the capacitor is adjusted via a variance of a thickness of the solder-stop layer and/or of the further bond layer and/or a size of the at least one region of the bond layer.

10. The method according to claim 3, wherein:
the first sacrificial carrier contains Si; and/or
the second sacrificial carrier contains $SiO_2$; and/or
the bond layer contains Ti, TiW, and/or Cr; and/or
the carrier substrate comprises $Si_3N_4$ and/or diamond; and/or
the contact layer contains Au.

11. A substrate-based circuit comprising:
a hollow conductor;
a carrier substrate attached within the hollow conductor;
a bond layer embodied on at least one part of the carrier substrate;
a contact layer embodied on at least one first part of the bond layer that forms at least one conductor line and/or at least one antenna element; and
at least one fastening element deposited at an outer region of the carrier substrate, the at least one fastening element projecting beyond the outer region of the carrier substrate.

12. The substrate-based circuit according to claim 11, wherein:
the at least one fastening element is formed of a same material as a material of the contact layer; and/or
in the outer region in which the at least one fastening element is connected to the carrier substrate, another bond layer is arranged between the at least one fastening element and the carrier substrate.

13. The substrate-based circuit according to claim 11, wherein:
the contact layer is embodied as a support surface for support of an electronic component; and/or
a second part of the bond layer is embodied at a defined distance from the support surface; and/or
at least part of the second part of the bond layer and/or a region between the second part of the bond layer and the support surface and/or at least a part of the support surface is provided with a solder-stop layer.

14. The substrate-based circuit according to claim 13, wherein:
the contact layer is located on an area between the bond layer and the solder-stop layer;
a further contact layer is located on a further area, of identical size as the contact layer, on the solder-stop layer or on the solder-stop layer and the bond layer;
the further contact layer is connected in an electrically conducting manner to the at least one fastening element; and
the contact layer is connected in an electrically conducting manner to the at least one conductor line and/or to the at least one antenna element, thereby forming a capacitor.

15. The substrate-based circuit according to claim 13, wherein:
the bond layer contains Ti, TiW, or Cr; and/or
the carrier substrate is made from $Si_3N_4$ and/or diamond; and/or
the solder-stop layer is made from $Si_3N_4$; and/or
the contact layer contains Au.

16. A hollow conductor comprising:
two hollow-conductor segments rigidly connected to one another, each hollow-conductor segment including a groove; and
a substrate-based circuit including:
a carrier substrate,
a bond layer embodied on at least one part of the carrier substrate,
a contact layer embodied on at least one first part of the bond layer that forms at least one conductor line and/or at least one antenna element, and
at least one fastening element deposited at an outer region of the carrier substrate, the at least one fastening element projecting beyond the outer region of the carrier substrate, and the at least one fastening element being clamped between the two hollow-conductor segments such that the substrate-based circuit is arranged centrally within a space in the hollow conductor formed by the respective grooves.

17. The hollow conductor according to claim 16, wherein at least one hollow-conductor segment provides at least one recess that is arranged perpendicular to the at least one antenna element such that a microwave signal can be supplied to the at least one antenna element.

* * * * *